US012628585B2

(12) United States Patent
Rostami et al.

(10) Patent No.: US 12,628,585 B2
(45) Date of Patent: May 12, 2026

(54) SELECTIVE ATOMIC LAYER ETCH OF Si-BASED MATERIALS

(71) Applicant: Tokyo Electron Limited, Tokyo (JP)

(72) Inventors: Mehrdad Rostami, Albany, NY (US); Yu-Hao Tsai, Albany, NY (US); Toru Hisamatsu, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 286 days.

(21) Appl. No.: 18/362,652

(22) Filed: Jul. 31, 2023

(65) Prior Publication Data

US 2025/0046614 A1 Feb. 6, 2025

(51) Int. Cl.
| | |
|---|---|
| *H10P 50/24* | (2026.01) |
| *H10P 76/40* | (2026.01) |
| *G03F 7/004* | (2006.01) |
| *G03F 7/20* | (2006.01) |

(52) U.S. Cl.
CPC .......... *H10P 50/242* (2026.01); *H10P 50/244* (2026.01); *H10P 76/40* (2026.01); *G03F 7/0043* (2013.01); *G03F 7/2004* (2013.01)

(58) Field of Classification Search
CPC .............. H01L 21/3065; H01L 21/033; H01L 21/31122; G03F 7/0043; G03F 7/2004; H10P 50/242; H10P 50/244; H10P 76/40
See application file for complete search history.

(56) References Cited

U.S. PATENT DOCUMENTS

| | | | |
|---|---|---|---|
| 9,996,004 B2 | 6/2018 | Smith et al. | |
| 10,732,505 B1 | 8/2020 | Meyers et al. | |
| 12,094,711 B2 * | 9/2024 | Yu ..................... | H01L 21/67167 |
| 2018/0337046 A1 | 11/2018 | Shamma et al. | |
| 2020/0118835 A1 | 4/2020 | Kanarik | |
| 2020/0312673 A1 * | 10/2020 | Tsai .................. | H01L 21/32138 |
| 2022/0020584 A1 | 1/2022 | Volosskiy et al. | |
| 2022/0037162 A1 * | 2/2022 | O'Meara .......... | H01J 37/32513 |
| 2022/0246438 A1 | 8/2022 | Han et al. | |
| 2025/0210363 A1 * | 6/2025 | Yang ................. | H01J 37/32449 |

FOREIGN PATENT DOCUMENTS

WO 2022164820 A1 8/2022

OTHER PUBLICATIONS

International Search Report and Written Opinion, PCT/US2024/025087, Mailed Aug. 12, 2024, Total pp. 11.
Altmannshofer et al., "Hydrogen microwave plasma treatment of Si and SiO2," Surface & Coatings Technology, vol. 304, Jul. 12, 2016, pp. 359-363.

(Continued)

*Primary Examiner* — Anita K Alanko

(74) *Attorney, Agent, or Firm* — Slater Matsil, LLP

(57) ABSTRACT

A method of processing a substrate that includes: forming a photoresist layer including a metal and oxygen over a substrate including silicon; patterning the photoresist layer using an extreme ultraviolet (EUV) photolithographic process, a portion of the substrate being exposed after the patterning; and performing an atomic layer etching (ALE) process to etch the substrate selectively relative to the patterned photoresist layer.

20 Claims, 8 Drawing Sheets

30

310 FORM PHOTORESIST LAYER COMPRISING METAL AND OXYGEN OVER SUBSTRATE COMPRISING SILICON

320 PATTERN PHOTORESIST LAYER USING EUV PHOTOLITHOGRAPHIC PROCESS

330 PERFORM ATOMIC LAYER ETCHING (ALE) PROCESS TO ETCH SELECTIVELY TO PATTERNED PHOTORESIST LAYER

(56)  References Cited

OTHER PUBLICATIONS

Cardineau et al., "EUV Resists based on Tin-Oxo Clusters," Advances in Patterning Materials and Processes XXXI, Proc. of SPIE vol. 9051, Apr. 4, 2014, pp. 90511B-1-90511B-12, doi: 10.1117/12. 2046536.

Hsiao et al., "On the Etching Mechanism of Highly Hydrogenated SiN Films by CF4/D2 Plasma: Comparison with CF4/H2," Coatings 2021, 11, 1535. https://doi.org/10.3390/coatings11121535, Dec. 14, 2021, 14 pages.

Ito et al., "Effects of hydrogen on plasma etching for silicon and silicon nitride," 21st International Symposium on Plasma Chemistry (ISPC 21), Sunday Aug. 4-Friday Aug. 9, 2013, Cairns Convention Centre, Queensland, Australia, 4 pages.

Ito et al., "Hydrogen effects in hydrofluorocarbon plasma etching of silicon nitride: Beam study with CF+, CF2+, CHF2+, and CH2F+ ions," Journal of Vacuum Science and Technology A: Vacuum, Surfaces and Films. vol. 29, No. 5, Jul. 28, 2011, 6 pages.

Kanarik et al., "Overview of atomic layer etching in the semiconductor industry," Journal of Vacuum Science & Technology A 33, Mar. 5, 2015, 15 pages.

Rastogi, et al., "Plasma etch patterning of EUV lithography: Balancing roughness and selectivity trade off," Procedures of SPIE, vol. 9782, Mar. 25, 2016, 8 pages.

* cited by examiner $CF_4$ over
H-Si $CF_4$ over
$OH-SnO_2$ $NF_3$ over
H-Si $NF_3$ over
$OH-SnO_2$

32

PERFORM ATOMIC LAYER ETCHING (ALE) PROCESS TO ETCH SILICON OF SUBSTRATE SELECTIVELY TO METAL OXIDE DISPOSED OVER SUBSTRATE — 332

EXPOSE SUBSTRATE TO HALOGEN-CONTAINING GAS IN ABSENCE OF PLASMA TO FORM MODIFIED SURFACE LAYER COMPRISING SILICON — 333

EXPOSE MODIFIED SURFCE TO FIRST PLASMA COMPRISING ARGON TO ETCH MODIFIED SURFACE LAYER — 335

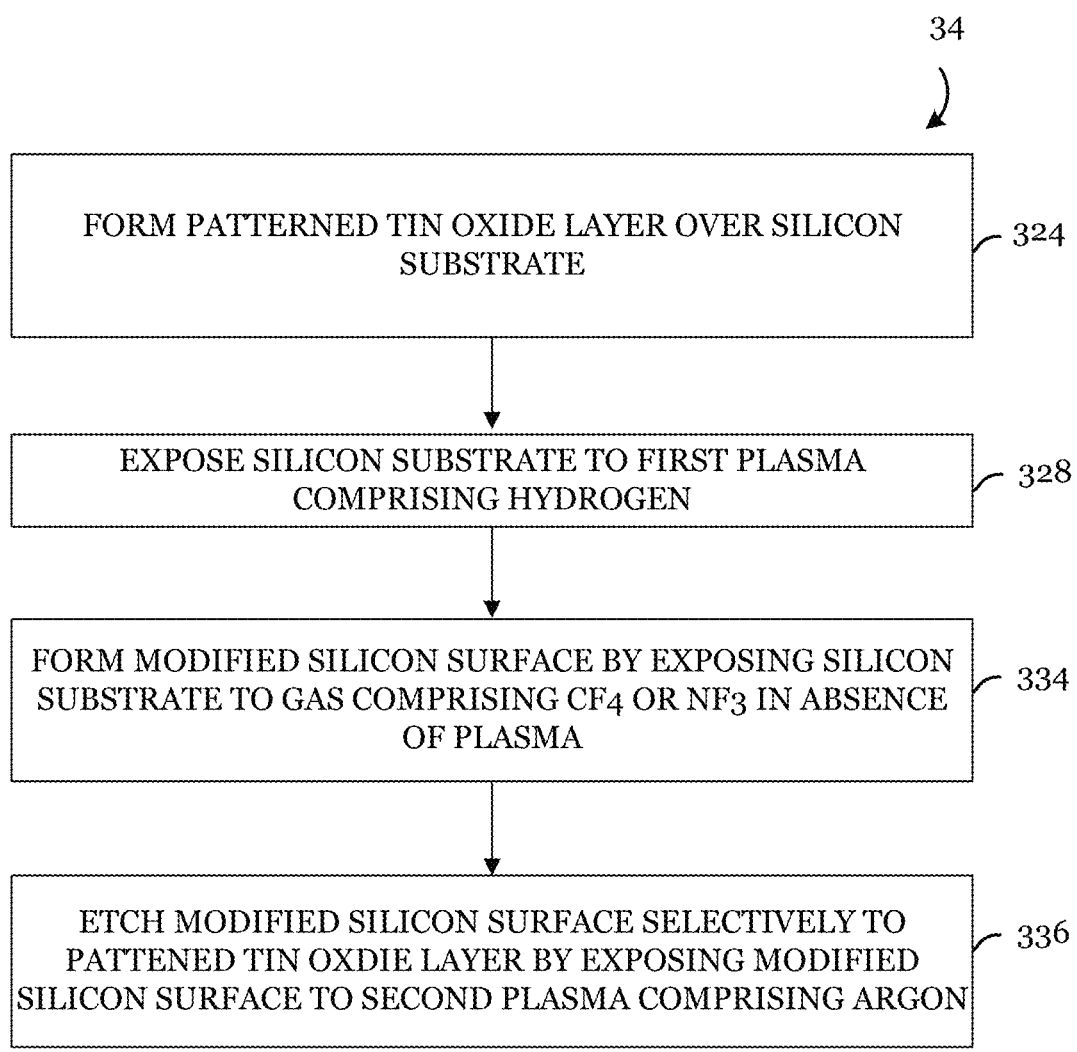

34

FORM PATTERNED TIN OXIDE LAYER OVER SILICON SUBSTRATE — 324

EXPOSE SILICON SUBSTRATE TO FIRST PLASMA COMPRISING HYDROGEN — 328

FORM MODIFIED SILICON SURFACE BY EXPOSING SILICON SUBSTRATE TO GAS COMPRISING CF4 OR NF3 IN ABSENCE OF PLASMA — 334

ETCH MODIFIED SILICON SURFACE SELECTIVELY TO PATTENED TIN OXDIE LAYER BY EXPOSING MODIFIED SILICON SURFACE TO SECOND PLASMA COMPRISING ARGON — 336

FIG. 3C

SELECTIVE ATOMIC LAYER ETCH OF Si-BASED MATERIALS

TECHNICAL FIELD

The present invention relates generally to methods of processing a substrate, and, in particular embodiments, to selective atomic layer etch (ALE) of Si-based materials.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Process flows used to form the constituent structures of semiconductor devices often involve depositing and removing a variety of materials while a pattern of several materials may be exposed in a surface of the working substrate. Etching is one of the key processes in such semiconductor device fabrication. In the modern semiconductor industry, etching is typically performed by wet etching using liquid etchants or dry etching such as reactive ion etching.

As an IC's critical dimension and feature size has shrunk below 10 nm, the semiconductor industry requires increased precision in dimensions (e.g., linewidths, etch depth, and film thicknesses) during etching processes. For example, atomic scale controllability may be necessary, which is difficult to realize with conventional etching technology. For this reason, alternative etching techniques that meet such requirements are highly desired.

SUMMARY

In accordance with an embodiment of the present invention, a method of processing a substrate that includes: forming a photoresist layer including a metal and oxygen over a substrate including silicon; patterning the photoresist layer using an extreme ultraviolet (EUV) photolithographic process, a portion of the substrate being exposed after the patterning; and performing an atomic layer etching (ALE) process to etch the substrate selectively relative to the patterned photoresist layer.

In accordance with an embodiment of the present invention, a method of processing a substrate that includes: performing an atomic layer etching (ALE) process to etch silicon of a substrate selectively to a metal oxide disposed over the substrate, the ALE process including in the absence of a plasma, exposing the substrate to a halogen-containing gas to form a modified surface layer including silicon, exposing the modified surface to a first plasma including argon (Ar) to etch the modified surface layer, and repeating the two exposure steps.

In accordance with an embodiment of the present invention, a method of processing a substrate that includes: forming a patterned tin oxide layer over a silicon (Si) substrate, a portion of the Si substrate being exposed after forming the patterned tin oxide layer; exposing the Si substrate to a first plasma including hydrogen; forming a modified Si surface by exposing the Si substrate to a gas including $CF_4$ or $NF_3$ in the absence of a plasma; and etching the modified Si surface selectively to the patterned tin oxide layer by exposing the modified Si surface to a second plasma including argon (Ar).

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1G illustrate cross sectional views of a substrate during an example process of semiconductor fabrication comprising an atomic layer etch (ALE) process in accordance with various embodiments, wherein FIG. 1A illustrates an incoming substrate comprising a metal oxide resist (MOR) layer, FIG. 1B illustrates the substrate after an ultraviolet (UV) exposure step, FIG. 1C illustrates the substrate after a development step, and FIG. 1D illustrates the substrate after pre-ALE treatment step, FIG. 1E illustrates the substrate after a modification step of the ALE process, FIG. 1F illustrates the substrate after a removal step of the ALE process, and FIG. 1G illustrates the substrate after cyclically repeating the steps of ALE process;

FIGS. 3A-3C illustrate process flow diagrams of methods of the ALE process in accordance with various embodiments, wherein FIG. 3A illustrates an embodiment, FIG. 3B illustrates an alternate embodiment, and FIG. 3C illustrates yet another embodiment;

FIGS. 5A and 5B illustrate a spatially segregated plasma system for performing the ALE process in accordance with certain embodiments, wherein FIG. 5A illustrates a top view and FIG. 5B illustrates a cross-sectional view.

DETAILED DESCRIPTION OF ILLUSTRATIVE EMBODIMENTS

This application relates to fabrication of semiconductor devices, more particularly to selective atomic layer etch (ALE) of silicon (Si)-based materials. Specifically, the methods of ALE may be applied to etch silicon selectivity to metal oxide resists (MOR) useful in extreme ultraviolet (EUV) lithography. EUV lithography, commonly based on approximately 13.5 nm wavelength, can extend current photolithographic technology beyond its optical limits by moving to smaller imaging source wavelengths to pattern small critical dimension features. Metal oxide cluster-based materials (e.g., containing tin (Sn) metal) have been found to be particularly suitable for direct EUV photopatterning because they strongly absorb EUV light compared to the conventional polymer-based resists. However, the MOR mask selectivity in a post-exposure pattern transfer etch may be poor and suffer pattern collapse, which poses a challenge in certain applications such as sub-5 nm technology node.

Embodiments of the present application disclose methods of atomic layer etch (ALE) that can improve the etch selectivity of silicon-based materials to a metal-containing layer, for example, a patterned metal oxide resist (MOR). ALE is a film etching technique that consists of sequential self-limiting reactions. The first step (modification step) modifies the surface by adsorption of a modifying agent to form a thin layer. The second step (removal step) is removal of at least a portion of the formed layer. The concept of ALE is analogous to atomic layer deposition (ALD). The difference is that during the second step of ALE, material is removed instead of being added as in ALD. Each step is self-limiting, and only a thin layer (e.g., atomic monolayer) is removed by one cycle of ALE process. To achieve a desired amount of etching, steps are typically repeated and so an ALE process generally refers to the sequential cycles of such steps. Various embodiments of the methods may use a halogen-containing gas (e.g., $CF_4$ or $NF_3$) as the modifying agent in the first step and a plasma treatment (e.g., Ar plasma) for the second step to etch silicon selectively to a MOR (e.g., $SnO_2$). One or more surface pretreatment steps (e.g., $H_2$ plasma treatment) may also be performed prior to or during the ALE process to improve the etch performance (e.g., selectivity). The methods of ALE herein may advantageously overcome the mask selectivity issue of MOR in high numerical aperture (NA) EUV lithography applications.

Figure 2:
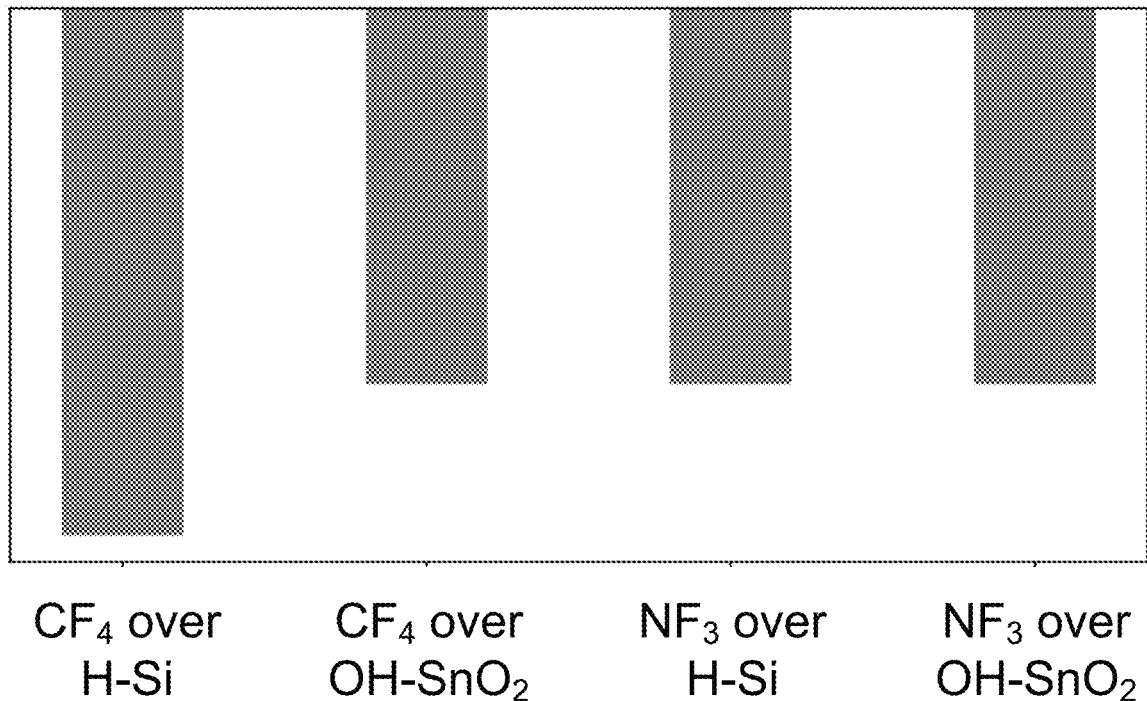
FIG. 2 illustrates simulated adsorption energies of fluorine-containing adsorbates ($CF_4$ and $NF_3$) useful in the modification step of the ALE process over two surfaces (Si and $SnO_2$)
Figure 3A:
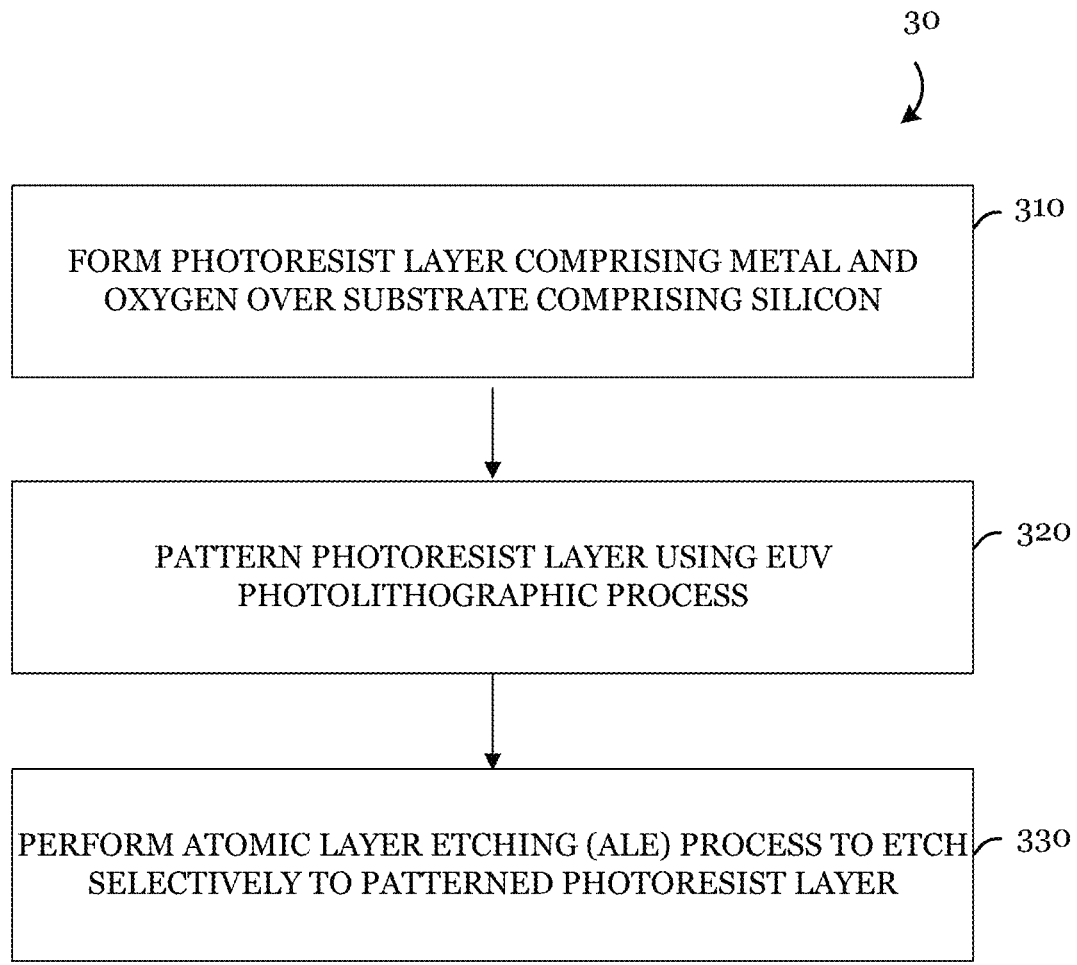
Figure 3B:
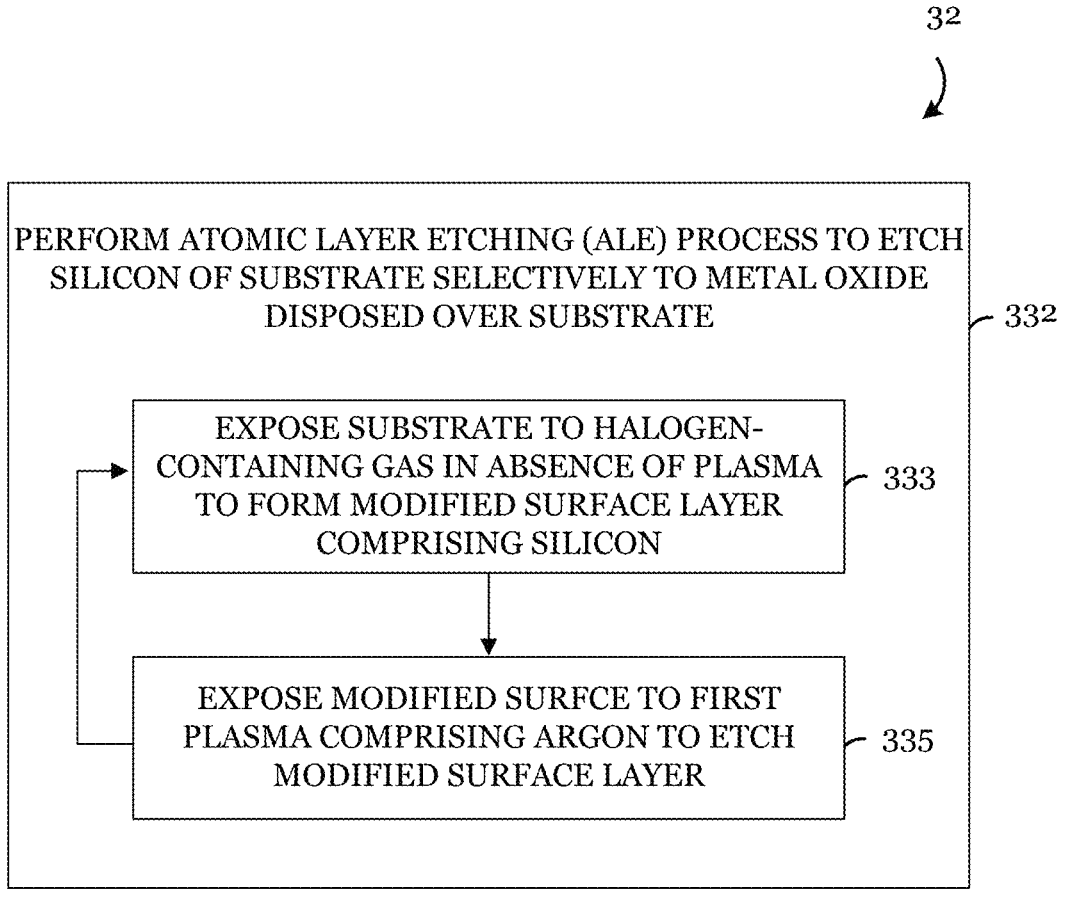
Figure 4:
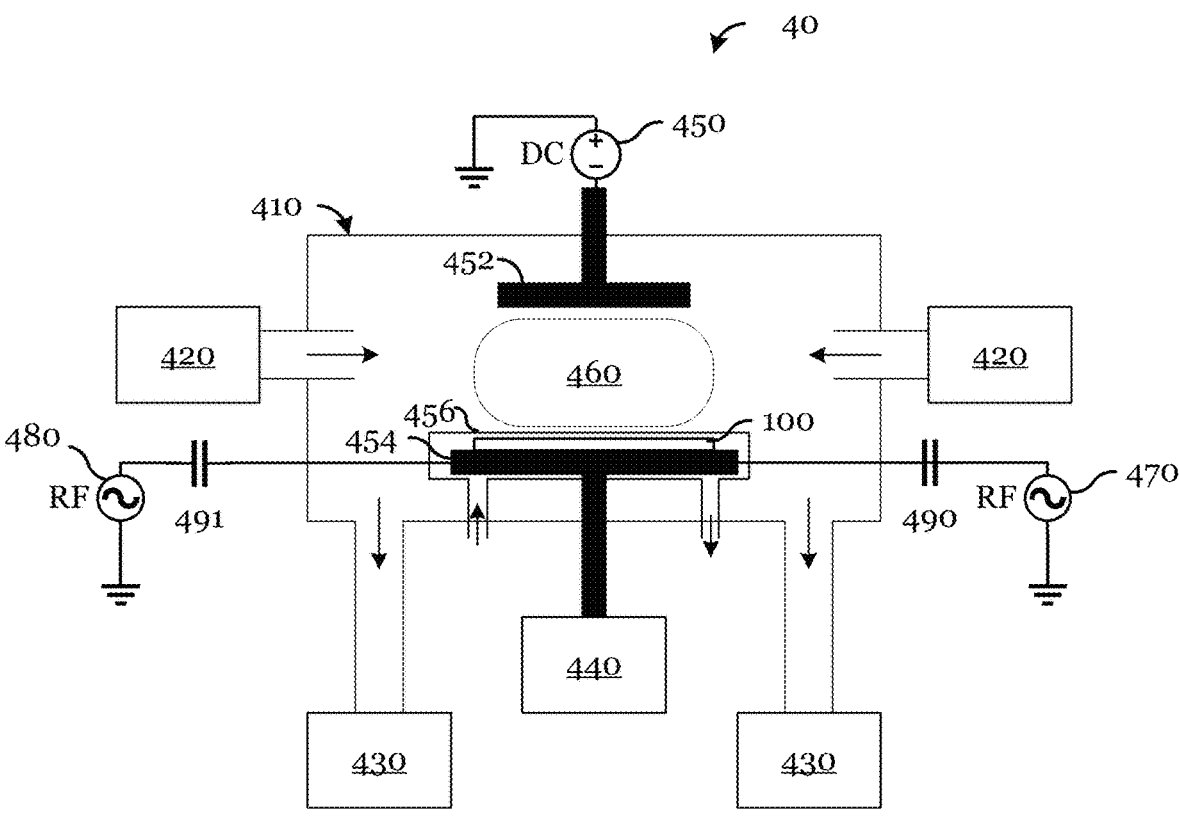
FIG. 4 illustrates a cross-sectional view of a plasma system for performing the ALE process in accordance with an embodiment.
Figure 5A:
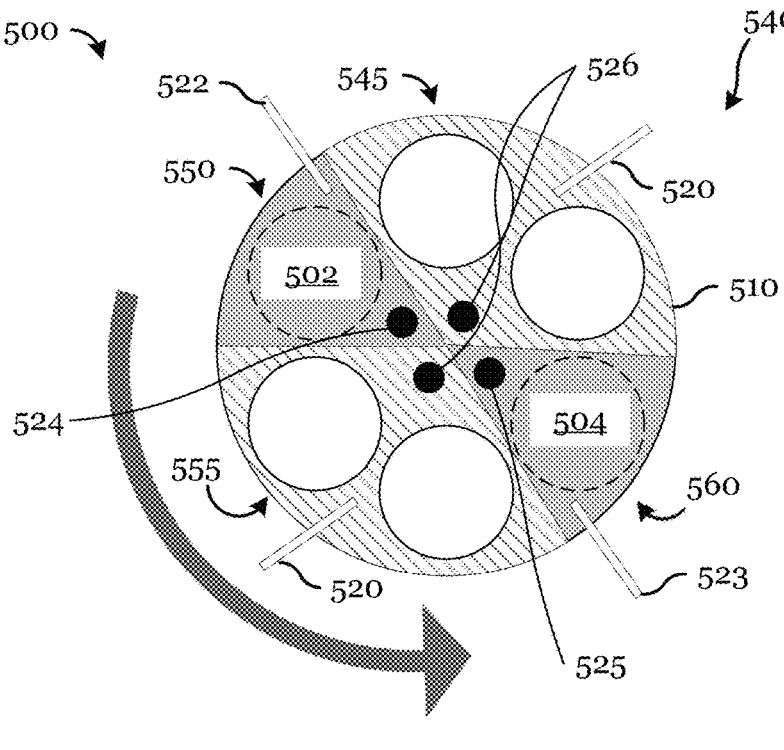
Figure 5B:
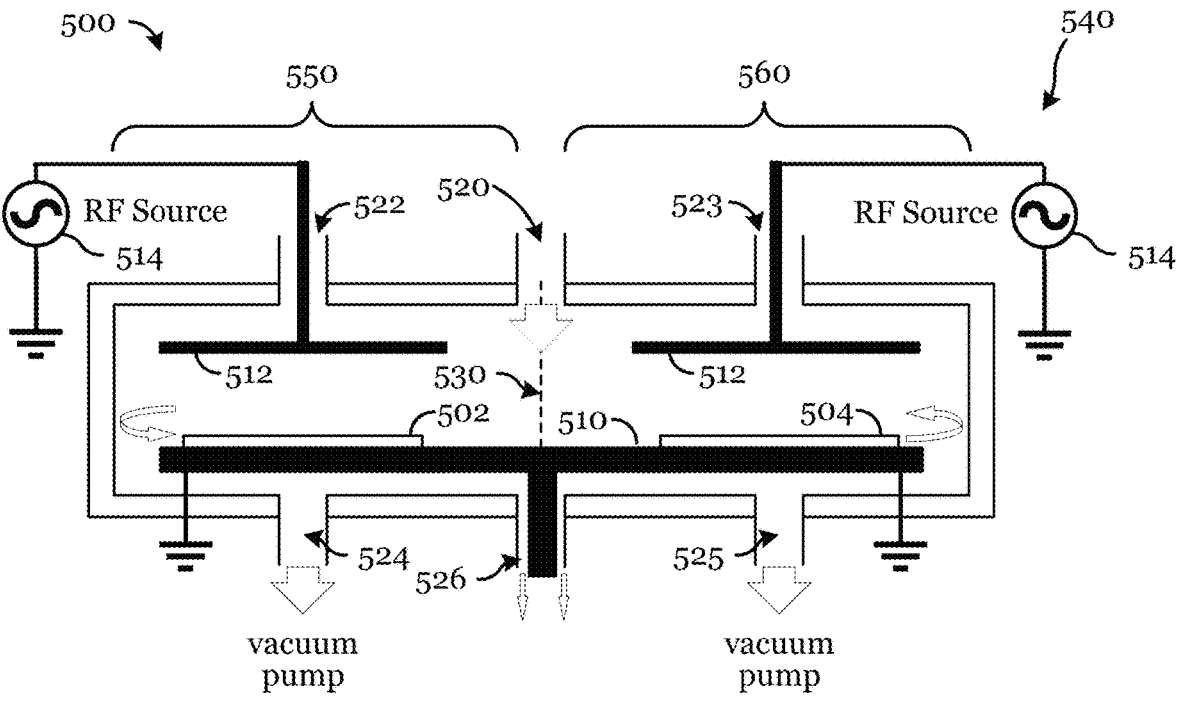

In the following, an example fabrication process comprising an atomic layer etch (ALE) process is described in accordance with various embodiments referring to FIGS. 1A-1G. The preferential adsorption of the modifying agent on the etch target surface (e.g., silicon) evidenced by simulation is illustrated in FIG. 2. Example process flow diagrams are illustrated in FIG. 3A-3C. FIGS. 4 and 5A-5B provide example plasma systems for performing the ALE process in accordance with various embodiments. All figures are drawn for illustration purpose only and not to scale, including the aspect ratios of features. Although this disclosure primarily describes embodiments of ALE methods for silicon etching selectively to a metal-containing EUV photoresist, the methods should not be limited to EUV lithography applications or lithography applications.

FIGS. 1A-1G illustrate cross sectional views of a substrate during an example process of semiconductor fabrication comprising an atomic layer etch (ALE) process in accordance with various embodiments.

Figure 1A:
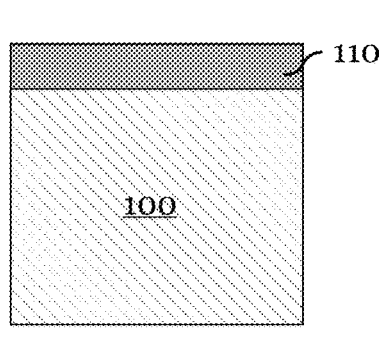

FIG. 1A illustrates a cross sectional view of an incoming substrate 100 comprising a metal oxide resist (MOR) layer 110.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate comprises heterogeneous layers such as silicon germanium on silicon, gallium nitride on silicon, silicon carbon on silicon, as well layers of silicon on a silicon or SOI substrate.

In various embodiments, the substrate 100 is a part of, or includes, a semiconductor device, and may have undergone a number of steps of processing following, for example, a conventional process. For example, the semiconductor structure may comprise a substrate 100 in which various device regions are formed. At this stage, the substrate 100 may include isolation regions such as shallow trench isolation (STI) regions as well as other regions formed therein. Accordingly, the substrate 100 is used to collectively refer to any structures formed therein.

In various embodiments, the substrate 100 may be an etch target for the atomic layer etch (ALE) process. In other embodiments, although not specifically illustrated in FIG. 1A, the substrate 100 may comprise a layer formed therein that is to be selectively etched to form a recess feature in the layer over the substrate 100.

As illustrated in FIG. 1A, the metal oxide resist (MOR) layer 110 may be formed over the substrate 100. In certain embodiments, the MOR layer 110 may be an EUV-active photoresist. In this disclosure, MOR is used to refer to any metal oxide-based photoresist. In general, a MOR comprises small metal oxide clusters with organic moieties, which can undergo a photoreaction upon UV exposure to form a stable, cross-linked metal oxide network structure. As further described below referring to FIGS. 1B-1C, the unreacted portion of the MOR can be selectively removed by a development step. The photoreaction may involve increasing M-O-M bonds and the removal of the organic moiety. Accordingly, the chemical composition of the MOR prior to and after the UV exposure, despite its name, may not necessarily be a stoichiometric metal oxide consisting of metal and oxygen, and only indicates the presence of metal and oxygen in the composition. In various embodiments, the MOR layer 110 may be a negative photoresist.

In certain embodiments, the MOR layer 110 may comprise a metal and oxygen. In one embodiment, the metal of the MOR layer 110 may be tin (Sn). The MOR layer 110 may be deposited over the substrate 100 using a dry process or wet process, for example, a spin-coating technique. In one or more embodiments using the spin-coating technique, the metal oxide resist (MOR) or precursors thereof may be dissolved in a solvent to prepare a photoresist solution, which is then dispensed from a nozzle to a central portion of the substrate 100. The photoresist solution onto the wafer may be dispensed either while the wafer is spun (i.e., dynamic dispense) or not (i.e., static dispense). The wafer is spun at a rate, for example, between 500 rpm and 4000 rpm, to exert a centrifugal force, which causes the photoresist solution to spread outwards and towards the edge of the substrate 100. As the solvent evaporates from the photoresist solution, the MOR layer 110 may be formed over the substrate 100, coating the surface of the substrate 100 uniformly. In certain embodiments, the MOR layer 110 has a thickness between 10 nm and 50 nm. The thickness of the MOR layer 110 may be selected in consideration of the target feature size and the technique for patterning. For example, for semiconductor fabrication for sub-5 nm nodes, such as 3 nm node, a thin MOR layer may be desired to achieve the feature size with satisfactory patterning performance. Accordingly, in one embodiment, the MOR layer 110 has a thickness between 5 nm and 20 nm.

The process conditions for the spin-coating technique may comprise spin speed, spin time, solvent system, and temperature among others. In certain embodiments, after the spin-coating, non-uniform features of the MOR layer 110 at the edge portion (e.g., edge bead) of the substrate 100 may be formed. These non-uniform features may be removed by a conventional edge bead removal (EBR) process, in which a solvent may be dispensed to the edge portion while spinning the substrate 100.

In certain embodiments, a soft bake may optionally be performed to thermally treat the substrate 100 to remove residual solvents from the MOR layer 110. The soft bake process may comprise heating the substrate 100 within a temperature range, e.g., between 75° C. and 100° C.

In alternate embodiments, one or more vapor deposition techniques may be used for the deposition. Examples may include but are not limited to chemical vapor deposition (CVD), physical vapor deposition (PVD), atomic layer deposition (ALD), as well as other plasma processes such as plasma enhanced CVD (PECVD).

Figure 1B:
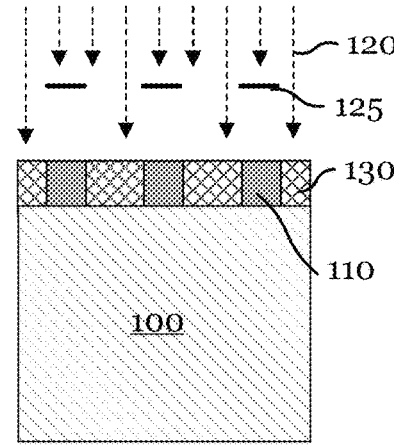

FIG. 1B illustrates a cross sectional view of the substrate 100 after an ultraviolet (UV) exposure step.

In FIG. 1B, a UV lithographic process may be performed by exposing the substrate 100 to UV radiation 120 through the photomask 125. With the photomask 125, only an unmasked region of the substrate 100 is irradiated with the UV radiation 120. In various embodiments, the UV radiation 120 is an extreme UV (EUV) (e.g., at a wavelength of 13.5 nm).

The dose of the exposure step may be selected to balance the pattern fidelity and the mask selectivity during the pattern transfer. In certain embodiments where EUV is used for the UV exposure step, the exposure may be performed in a low-dose exposure regime, for example, between 1 mJ/cm$^2$ and 10 mJ/cm$^2$. While the low-dose exposure can improve the process efficiency and minimizing the impact of the UV irradiation on the device structure, it may adversely affect the tonality of the photoresist and thereby compromise the mask selectivity. Accordingly, an improved selectivity of the subsequent pattern transfer etch may be necessary. The methods of ALE process in various embodiments may improve the mask selectivity and be used to mitigate this issue in the low-dose exposure regime. The low-dose exposure regime in the lithography may particularly be useful in applications such as low-power, high-performance metal-oxide-semiconductor (MOS) devices, high-resolution optical devices, and high-density memory devices with a higher capacity. Further, in other embodiments, the methods with the low-dose exposure regime may be applied for fabricating transparent electrodes used in, for example, solar cells and touch screens.

In the illustrated example, the MOR layer 110 functions as a negative tone photoresist. Accordingly, directly or indirectly in response to the UV exposure, the exposed region of the MOR layer 110 is converted to a reacted metal oxide 130. On the other hand, a masked region of the MOR layer 110 remains unreacted. The reacted metal oxide 130 may have a substantially higher etch resistance due to a more dense, cross-linked metal oxide network structure compared to the MOR layer 110, and the difference in the material characteristics among the two regions (i.e., reacted and unreacted) may enable the tonality as a UV photoresist.

In certain embodiments, after the UV exposure step, a post-exposure bake (PEB) may optionally be performed by thermally treating the substrate 100. The PEB may be beneficial in ensuring residual solvent removal and/or further differentiating the material properties of the reacted metal oxide 130 from that of the MOR layer 110. In one or more embodiments, the PEB may be performed at 80-220° C.

Figure 1C:
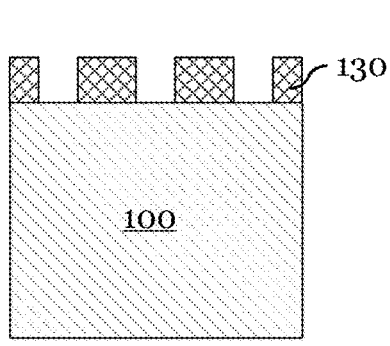

FIG. 1C illustrates a cross sectional view of the substrate 100 after a development step.

After completing the UV exposure step and the optional post-exposure bake (PEB), the development step may be performed. In the illustrated embodiments of FIG. 1C, the remaining unreacted portion of the MOR layer 110 may be removed selectively to the reacted metal oxide 130. In various embodiments, the reacted metal oxide 130 after the development step may provide a pattern to be transferred to an underlying structure for semiconductor fabrication. In the illustrated embodiments of FIGS. 1A-1G, the pattern may be transferred to the body of the substrate 100, but in other embodiments, a semiconducting or dielectric layer formed over the substrate 100 may be patterned accordingly. The pattern formed by the UV photolithographic process (e.g., FIGS. 1A-1C) may comprise a via, line recess, or any recess feature useful in semiconductor fabrication. In one embodiment, the pattern of the reacted metal oxide 130 may have a pitch size between 10 nm and 40 nm.

The development step may be a wet or dry process. Conventionally, a photoresist may be removed by treating the substrate with a developing solution to dissolve the reacted (in case of a positive tone resist) or unreacted (in case of a negative tone resist) regions of the photoresist. A similar wet process may be applied in various embodiments to remove the MOR layer 110. Alternately, a dry process may be used in other embodiments. The dry process may comprise, for example, a selective plasma etch process or a thermal process, advantageously eliminating the use of a developing solution. In certain embodiments, the dry process may be performing using reactive ion etching (RIE) process or atomic layer etching (ALE).

Figure 1D:
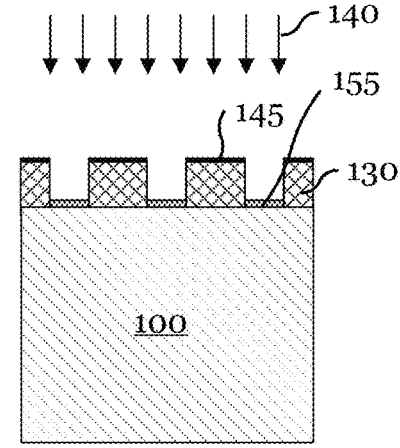

FIG. 1D illustrates a cross sectional view of the substrate 100 after pre-ALE treatment step.

After the development step, one or more pre-ALE treatment steps may be performed to condition the exposed surface for the sequent ALE process. In various embodiments, the pre-ALE treatment step may comprise exposing the substrate 100 to a plasma 140 comprising hydrogen (e.g., H$_2$ plasma). In various embodiments, after the exposure to the plasma 140, the surface conditions of the reacted metal oxide 130 and the substrate 100 may be modified. In FIG. 1D, a modified metal oxide surface 145 and a modified silicon surface 155 are illustrated. In one embodiment, a hydrogen plasma treatment may advantageously improve the selectivity of the modification step of the ALE process, for example, by increasing hydroxyl groups on the modified metal oxide surface 145 and hydrogenated silicon on the modified silicon surface 155. In certain embodiments, another pre-ALE treatment step may also be performed prior to the hydrogen plasma treatment. In one embodiment, the substrate 100 may be exposed to a fluorine-containing gas prior to the hydrogen plasma treatment. Examples of the fluorine-containing gas for the pre-ALE treatment step include but are not limited to NF$_3$, CF$_4$, and C$_2$F$_4$. Although not wishing to be limited by any theory, these pre-ALE treatment steps may advantageously help removing impurities from the surface In one or more embodiments, the pre-ALE treatment, especially the hydrogen plasma treatment, may also be useful to reduce the surface of the substrate 100. In one embodiment, a native oxide formed on the surface of the substrate (e.g., silicon oxide) may be removed by the hydrogen plasma treatment and increase the reactivity during the ALE process. Further, such a treatment can advantageously enable the application of ALE process to various etch target materials. For example, an oxide material such as silicon oxide may also be etched selectively to the MOR layer 110. The surface of silicon oxide may first be reduced by the hydrogen plasma treatment or other reducing steps, and then the reduced surface may be etched by the ALE. Each cycle of the ALE may therefore further include the reduction step to continuously form a new reduced surface available for the next cycle of the ALE process. In one or more embodiments, the plasma 140 may be a remote plasma generated using a remote plasma source.

In various embodiments, after the pre-ALE treatment step, the substrate 100 may be gradually etched using the ALE process. The ALE process may comprise cyclically repeating the modification step (FIG. 1E) and the removal step (FIG. 1F) to achieve the target etch profile. Each cycle of the ALE process may remove the material (e.g., silicon of the substrate 100) layer by layer (e.g., atomic monolayer in ALE or a few stacks of monolayers in pseudo-ALE).

Figure 1E:
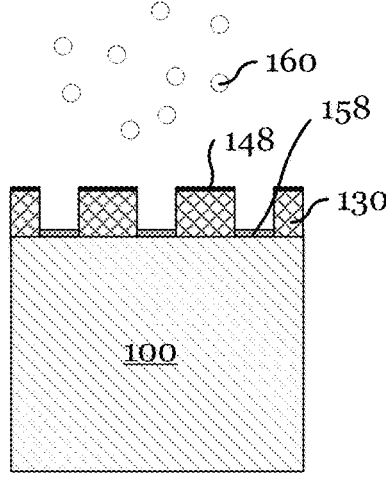

FIG. 1E illustrates a cross sectional view of the substrate 100 after a modification step of the ALE process.

The modification step may be performed by exposing the substrate 100 to a modification gas 160 comprising a halogen. In various embodiments, the modification gas 160 may comprise CF$_4$ or NF$_3$. In certain embodiments, the modification gas may further comprise an inert carrier gas such as helium (He), argon (Ar), and nitrogen (N$_2$), at any ratio. In various embodiments, the chamber may be first filled with a flow of inert gas, and then the halogen-containing gas (e.g., CF$_4$) may be sequentially supplied as pulses to the inert carrier flow.

In various embodiments, the modification step may be performed as a non-plasma process in the absence of plasma. In certain embodiments, the substrate 100 may be kept at temperature between 0° C. and 100° C. during the modification step. In another embodiment, the temperature may be maintained between −100° C. and 40° C. In one embodiment, the non-plasma process for the modification step may be performed at the pressure between 10 mT and 760 Torr and the gas flow rate between 10 sccm and 1000 sccm.

In FIG. 1E, a halogen-treated metal oxide surface 148 and a halogen-treated silicon surface 158 are illustrated. The inventors of this application identified the adsorption of the halogen-containing gas (e.g., CF$_4$) can be favored over the modified silicon surface 155 of the substrate 100 more than over the reacted metal oxide '130, which can advantageously improve the selectivity of ALE of silicon-based materials to metal oxide materials. It should be noted, however, that the halogen-containing gas molecules used in the modification step may or may not chemically react with the modified metal oxide surface 145 or the modified silicon surface 155 of FIG. 1D. In certain embodiments, the halogen-treated metal oxide surface 148, the halogen-treated silicon surface 158, or both may primarily comprise physisorbed molecules of the halogen-containing gas.

In certain embodiments, after exposing to the modification gas 160, the process chamber holding the substrate 100 may be purged with an inert gas. In a purge process, the substrate 100 may be exposed to a stream of inert gas such as helium (He), argon (Ar), or nitrogen (N$_2$). In some embodiments, the process chamber may be evacuated instead of purging. Still in certain embodiments, both purging and evacuation may be performed. In certain embodiments, the duration of purge/evacuation process may be between 0.5 sec and 300 sec.

Figure 1F:
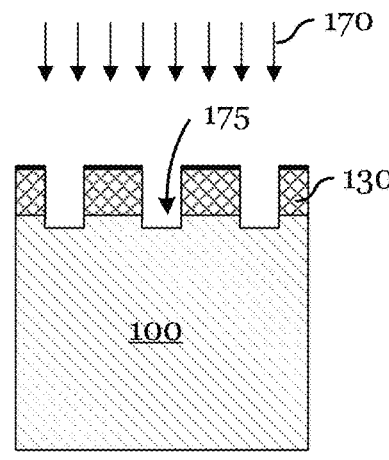

FIG. 1F illustrates a cross sectional view of the substrate 100 after a removal step of the ALE process.

The removal step of the ALE process may comprise exposing the substrate 100 to a plasma 170 to form a recess 175 in the substrate 100. The depth of the recess 175 in FIG. 1F is arbitrarily enlarged for illustration purpose. In various embodiments, the plasma 170 may comprise argon (Ar), other noble gases, dinitrogen (N$_2$), or a mixture thereof at any mixture ratio. The bombardment of species (e.g., Ar$^+$ ions) of the plasma 170 may leads to the dissociation of the adsorbed halogen-containing gas on the halogen-treated silicon surface 158 and the formation of etchant species (e.g., F radicals). On the other hand, etching of the halogen-treated metal oxide surface 148 may be substantially slower compared to the halogen-treated silicon surface 158. Various plasma parameters (e.g., source power and bias power) may be adjusted such that the plasma 170 may provide a sufficient energy to enable material removal. With the bias power, the bombardment may be made highly directional and the ALE process may be tuned to be anisotropic, but in other embodiments, an isotropic ALE may be enabled. In one or more embodiments, the plasma 170 may be formed from Ar and one or more reactive gases (e.g., H$_2$).

In certain embodiments, the substrate 100 may be kept at temperature between 0° C. and 100° C. during the removal step. In another embodiment, the temperature may be maintained between -100° C. and 40° C. In one embodiment, the plasma process for the removal step may be performed at the pressure between 10 mT and 100 mT, the gas flow rate between 50 sccm and 500 sccm, and a source power between 50 W and 1000 W.

Figure 1G:
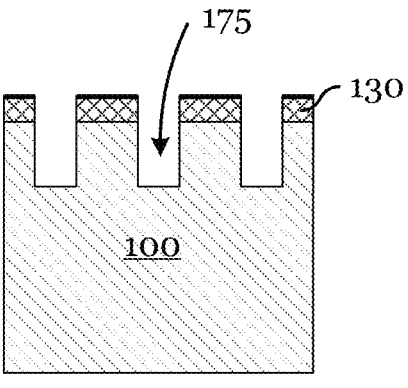

FIG. 1G illustrates a cross sectional view of the substrate 100 after cyclically repeating the steps of ALE process.

In FIG. 1G, the recess 175 may be extended to a target depth by cyclically repeating the modification step (FIG. 1E) and the removal step (FIG. 1F). In certain embodiments, one or more of the pre-ALE treatment steps (e.g., hydrogen plasma treatment) may also be repeated as a part of the cyclic process of ALE. Process conditions for each step of the ALE process may be kept the same for each cycle or may be modified as the process proceeds with cycles. With the appropriate conditions, the etch selectivity may be sufficient to minimize the etching of the reacted metal oxide 130, and the recess 175 may be formed without entirely consuming the reacted metal oxide 130, which may advantageously improve the overall process efficiency of EUV photolithographic process using a metal-oxide resist (MOR) and subsequent pattern transfer steps. In certain embodiments, after completing the ALE process to form the recess 175, the remaining portion of the reacted metal oxide 130 over the substrate 100 may be removed, for example, by a hydrogen-based plasma etching process.

FIG. 2 illustrates simulated adsorption energies of fluorine-containing adsorbates (CF$_4$ and NF$_3$) useful in the modification step of the ALE process over two surfaces (Si and SnO$_2$).

Through computational energy calculation, the inventors of this application demonstrated a preferential adsorption of an etchant precursor over an etch target surface. In FIG. 2, the simulated adsorption energies of CF$_4$ and NF$_3$ as example modification gas components are plotted for Si and SnO$_2$ surfaces. The adsorption energy is shown to be greater on the Si surface for both gases. In case of CF$_4$, the adsorption energy is almost twice larger on the Si surface than on the SnO$_2$ surface, and in case of NF$_3$ it is more than four times. This difference in adsorption energy suggests that during the modification step the modification gas may advantageously adsorb over the Si surface than the metal oxide surface, which means more fluorine species may be formed over the silicon surface as the etchant during the subsequent removal step. Accordingly, the combination of a fluorine-containing modification gas and a plasma treatment (e.g., Ar plasma) for the ALE process may advantageously improving the etch selectivity of silicon to metal oxide.

As further illustrated in FIG. 2, the favored adsorbate for adsorption is shown to be different for the two surfaces. On the Si surface, the adsorption energy of NF$_3$ is greater than that of CF$_4$, while the relationship is opposite on the SnO$_2$ surface ($E_{ads-CF4}>E_{ads-NF3}$). In other words, the difference in adsorption energy between the two surfaces (Si versus SnO$_2$) is greater when NF$_3$ is used for the adsorbate. This demonstrates that the composition of the halogen-containing modification gas may be selected and optimized in view of the adsorption energy of different materials to be etched and protected.

Various embodiments of the ALE process as described above may advantageously overcome the current issue of metal oxide resist (MOR) such as tin oxide-based resist in EUV photolithographic applications by offering an improved etch selectivity. In particular, the use of the halogen-containing modification gas in the absence of plasma in the modification step may enable better control on etch selectivity and process flexibility. Simultaneously, the damage and consumption of the MOR may be suppressed and therefore minimizing the risk of pattern collapse during the pattern transfer to an underlying structure. The ability to use tin oxide-based resist may further improve the EUV photolithography in terms of critical dimension uniformity (CDU), yield, and process reliability among others. These advantages of the ALE process may particularly be useful in applications where a thin photoresist layer (e.g., the MOR layer 110) may be used. In general, the thinner a photoresist layer becomes, the better etch selectivity a subsequent pattern transfer etch may require. As a result, conventional pattern transfer techniques such as reaction ion etch (RIE) may not be sufficiently selective.

FIGS. 3A-3C illustrate process flow diagrams of methods of the ALE process in accordance with various embodiments. The process flow can be followed with the figures discussed above (e.g., FIGS. 1A-1G) and hence will not be described again.

In FIG. 3A, a process flow 30 may start with forming a photoresist layer comprising a metal and oxygen over a substrate comprising silicon (block 310, FIG. 1A), followed by patterning the photoresist layer using an extreme ultraviolet (EUV) photolithographic process, where a portion of the substrate may be exposed after the patterning (block 320, FIGS. 1B-1C). An atomic layer etching (ALE) process may then be performed to etch the substrate selectively to the patterned photoresist layer (block 330, FIGS. 1E-1G).

In FIG. 3B, another process flow 32 may comprise performing an atomic layer etching (ALE) process to etch silicon of a substrate selectively to a metal oxide disposed over the substrate (block 332). In various embodiments, the ALE process may comprise first exposing the substrate to a halogen-containing gas in the absence of a plasma to form a modified surface layer comprising silicon (block 333, FIG. 1E), and exposing the modified surface to a first plasma comprising argon (Ar) to etch the modified surface layer (block 335, FIG. 1F). The two exposure steps may be repeated to achieve a target etch depth (FIG. 1G).

In FIG. 3C, another process flow 34 may start with forming a patterned tin oxide layer over a silicon (Si) substrate, where a portion of the Si substrate being exposed after forming the patterned tin oxide layer (block 324, FIGS. 1A-1C). The Si substrate may then be exposed to a first plasma comprising hydrogen (block 328, FIG. 1D). Subsequently, a modified Si surface may be formed by exposing the Si substrate to a gas comprising $CF_4$ or $NF_3$ in the absence of a plasma (block 334, FIG. 1E), followed by etching the modified Si surface selectively to the patterned tin oxide layer by exposing the modified Si surface to a second plasma comprising argon (Ar) (block 336, FIG. 1F).

FIG. 4 illustrates a cross-sectional view of a plasma system for performing the ALE process in accordance with an embodiment.

For illustrative purposes, FIG. 4 illustrates a substrate 100 placed on a substrate holder 454 (e.g., a circular electrostatic chuck (ESC)) inside a plasma processing chamber 410 near the bottom. The substrate 100 may be optionally maintained at a desired temperature using a heater/cooler 456 that surrounds the substrate holder 454. The temperature of the substrate 100 may be maintained by a temperature controller 440 connected to the substrate holder 454 and the heater/cooler 456. The ESC may be coated with a conductive material (e.g., a carbon-based or metal-nitride based coating) so that electrical connections may be made to the substrate holder 454.

As illustrated in FIG. 4, the substrate holder 454 may be a bottom electrode of the plasma processing chamber 410. In the illustrative example in FIG. 4, the substrate holder 454 is connected to two RF-bias power sources, 470 and 480 through blocking capacitors 490 and 491. In some embodiment, a conductive circular plate inside the plasma processing chamber 410 near the top is the top electrode 452. In FIG. 4, the top electrode 452 is connected to a DC power source 450 of the plasma processing system 40.

The gases may be introduced into the plasma processing chamber 410 by a gas delivery system 420. The gas delivery system 420 comprises multiple gas flow controllers to control the flow of multiple gases into the chamber. Each of the gas flow controllers of the gas delivery system 420 may be assigned for each of fluorocarbons, noble gases, or balancing agents. In some embodiments, optional center/edge splitters may be used to independently adjust the gas flow rates at the center and edge of the substrate 100.

The RF-bias power sources 470 and 480 may be used to supply continuous wave (CW) or pulsed RF power to sustain the plasma, such as a plasma 460. The plasma 460, shown between the top electrode 452 and the bottom electrode (also the substrate holder 454), exemplifies direct plasma generated close to the substrate 100 in the plasma processing chamber 410 of the plasma processing system 40. Etching may be performed by exposing the substrate 100 to the plasma 460 while powering the substrate holder 454 with RF-bias power sources 470, 480 and optionally the top electrode 452 with the DC power source 450.

The configuration of the plasma processing system 40 described above is by example only. In alternative embodiments, various alternative configurations may be used for the plasma processing system 40. For example, inductively coupled plasma (ICP) may be used with RF source power coupled to a planar coil over a top dielectric cover, the gas inlet or the gas outlet may be coupled to the upper wall, etc. In various embodiments, the RF power, chamber pressure, substrate temperature, gas flow rates and other plasma process parameters may be selected in accordance with the respective process recipe. In some embodiments, the plasma processing system 40 may be a resonator such as a helical resonator.

FIGS. 5A and 5B illustrate a spatially segregated plasma system 500 for performing the ALE process in accordance with another embodiment. FIG. 5A is a top view and FIG. 5B is a cross-sectional view.

In FIG. 5A, the plasma system 500 may comprise four spatially segregated sections of a spatial processing chamber 540. The steps of the ALE process may be performed by moving the substrate through the four spatially segregated sections of the spatial processing chamber 540 using for example, a rotatable stage 510.

In the top view illustrated in FIG. 5A, the rotatable stage 510 is segregated into four sections, a first purge section 545, a first processing section 550, a second purge section 555, and a second processing section 560. The first and second purge sections 545 and 555 both function as inert gas curtains that separate the two processing sections 550 and 560. An inert gas (e.g., argon, helium, or $N_2$) is introduced through one of gas inlets 520. Each section may comprise one or more gas inlets and outlets. In FIG. 5A, the first processing section 550 has a gas inlet 552 and a gas outlet 524, the second processing section 560 has a gas inlet 523 and a gas outlet 525, and the two purge sections 545 and 555 have gas inlets 520 and gas outlets 526. In various embodiments, the modification step of the ALE process may be performed in the first processing section 550, and the removal step of the ALE process in the second processing section 560. The two purge sections 545 and 555 may be used to remove any remaining gas or gas byproducts from the previous step. In various embodiments, the purge gas may comprise a noble gas or dinitrogen ($N_2$). Using the rotatable stage 510, these steps may be cyclically repeated as a cyclic etch process (pseudo-ALE or ALE) to gradually etch a target layer (e.g., a silicon substrate). In various embodiments, as previously described, the modification step may be a non-plasma process and the removal step may be a plasma process. Accordingly, at least one of the processing sections (e.g., the second processing section 560) of the plasma system 500 is configured to sustain a plasma and perform a plasma process. In another embodiment, a pre-treatment step (e.g., $H_2$ plasma) may also be performed in the plasma system 500, where the plasma system 500 may comprise at least two processing sections, each of which is configured to sustain a plasma.

As further illustrated in FIG. 5A, a plurality of substrates may be loaded on the rotatable stage 510. A first substrate 502, shown loaded on the rotatable stage 510 in the first processing section 550, may be undergoing the initial modification step (e.g., $CF_4$/$NF_3$ exposure). As the rotatable stage 510 rotates, the first substrate 502 will be moved next to the second purge section 555 for purging, and then to the second processing section 560 for the removal step (e.g., Ar plasma exposure). Simultaneously, another substrate 504, which is positioned at the opposite side of the first substrate 502 on the rotatable stage 510 (e.g., initially in the second processing section 560 as illustrated in FIG. 5A), can also be processed while moving from the second processing section 560 to the first purge section 545, and then the first processing section 550, followed by a next rotation. Accordingly, a plurality of substrates may be undergoing different steps of the cyclic deposition process at the same time. One revolution of the rotatable stage 510 would be equivalent of performing one cycle of the cyclic deposition process.

In various embodiments, the first and second processing sections 550 and 560 may be each configured to sustain a plasma for processing, although the ALE process may use only one of them for a plasma process. In other embodiments, only one of the two processing sections may be configured to sustain a plasma. In the cross-sectional view illustrated in FIG. 5B, the processing sections 550 and 560 are visible. In the example spatial processing chamber 540, the processing sections 550 and 560 are configured to sustain capacitively coupled plasma (CCP) using top electrodes 512 coupled to RF power sources 514. In the example embodiment illustrated in FIG. 5B, the rotatable stage 510 has been electrically coupled to ground. The grounded rotatable stage 510 may serve as a bottom electrode. The gas outlets 524, 525, and 526 may be connected to vacuum pumps of a gas flow system and controlled to maintain desired pressure and gas flow for the corresponding section.

The plasma system of the spatially segregated plasma system 500 as illustrated in FIG. 5B is by example only, and other plasma configuration may be used. In various alternative embodiments, the plasma system may be configured to sustain inductively coupled plasma (ICP). In other embodiments, the cyclic deposition process may be a non-plasma process and may still be performed using the spatially segregated plasma system 500 or the like without striking a plasma during the deposition.

Example embodiments of the invention are described below. Other embodiments can also be understood from the entirety of the specification as well as the claims filed herein.

Example 1. A method of processing a substrate that includes: forming a photoresist layer including a metal and oxygen over a substrate including silicon; patterning the photoresist layer using an extreme ultraviolet (EUV) photolithographic process, a portion of the substrate being exposed after the patterning; and performing an atomic layer etching (ALE) process to etch the substrate selectively relative to the patterned photoresist layer.

Example 2. The method of example 1, where the ALE process includes: exposing the substrate to a gas including a halogen; exposing the substrate to a first plasma including argon (Ar) to etch the substrate; and repeating the two exposure steps.

Example 3. The method of one of examples 1 or 2, where the gas includes $CF_4$ or $NF_3$.

Example 4. The method of one of examples 1 to 3, where the ALE process further includes exposing the substrate to a second plasma including hydrogen prior to the exposing to the gas including the halogen.

Example 5. The method of one of examples 1 to 4, further including, prior to the ALE process, exposing the substrate to a fluorine-containing gas.

Example 6. The method of one of examples 1 to 5, where the patterned photoresist layer includes tin oxide.

Example 7. The method of one of examples 1 to 6, where the substrate is a silicon (Si) substrate.

Example 8. The method of one of examples 1 to 7, where the substrate include silicon oxide, the method further including a reduction step to reduce a surface of the substrate to silicon prior to the ALE process.

Example 9. A method of processing a substrate that includes: performing an atomic layer etching (ALE) process to etch silicon of a substrate selectively to a metal oxide disposed over the substrate, the ALE process including in the absence of a plasma, exposing the substrate to a halogen-containing gas to form a modified surface layer including silicon, exposing the modified surface to a first plasma including argon (Ar) to etch the modified surface layer, and repeating the two exposure steps.

Example 10. The method of example 9, where the metal oxide includes tin oxide, and where the halogen-containing gas includes $CF_4$ or $NF_3$.

Example 11. The method of one of examples 9 or 10, where the ALE process removes the silicon at a first etch rate and the metal oxide at a second etch rate, the first etch rate being greater than the second etch rate.

Example 12. The method of one of examples 9 to 11, where the ALE process further includes, prior to the exposing to the halogen-containing gas, exposing the substrate to a second plasma including hydrogen in the plasma etch chamber.

Example 13. The method of one of examples 9 to 12, where the ALE process is performed in a plasma etch chamber, the ALE process further including, after the exposing to the first plasma, purging etch products from the plasma etch chamber.

Example 14. The method of one of examples 9 to 13, where the ALE process is performed using a plasma system including a first process section and a second process section, and where the exposing to the halogen-containing gas is performed in the first process section and the exposing to the first plasma in the second section.

Example 15. The method of one of examples 9 to 14, where the plasma system including a rotating stage configured to hold the substrate, the ALE process further including transferring the substrate from the first process section to the second process section by rotating the rotating stage.

Example 16. A method of processing a substrate that includes: forming a patterned tin oxide layer over a silicon (Si) substrate, a portion of the Si substrate being exposed after forming the patterned tin oxide layer; exposing the Si substrate to a first plasma including hydrogen; forming a modified Si surface by exposing the Si substrate to a gas including $CF_4$ or $NF_3$ in the absence of a plasma; and etching the modified Si surface selectively to the patterned tin oxide layer by exposing the modified Si surface to a second plasma including argon (Ar).

Example 17. The method of example 16, where forming the patterned tin oxide layer includes: forming a photoresist layer over the Si substrate, the photoresist layer including tin and oxygen; exposing the photoresist layer to a pattern of an extreme ultraviolet (EUV) irradiation, an EUV-exposed portion of the photoresist forming tin oxide; and developing the photoresist layer to remove an unreacted portion of the photoresist layer and form the patterned tin oxide layer from the EUV-exposed portion of the photoresist.

Example 18. The method of one of examples 16 or 17, where the exposing to the pattern of the EUV irradiation is performed with a dose between 1 mJ/cm$^2$ and 30 mJ/cm$^2$.

Example 19. The method of one of examples 16 to 18, where the patterned tin oxide layer has a pattern with a pitch size between 10 nm and 40 nm.

Example 20. The method of one of examples 16 to 19, where the exposing to the gas is performed at a temperature between 10° C. and 30° C.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of processing a substrate, the method comprising:
   forming a photoresist layer comprising a metal and oxygen over a silicon substrate in a process chamber;
   patterning the photoresist layer using an extreme ultraviolet (EUV) photolithographic process, a portion of the silicon substrate being exposed after the patterning; and
   performing an atomic layer etching (ALE) process to etch the silicon substrate selectively relative to the patterned photoresist layer, wherein the ALE process comprises:
   flowing an inert gas into the process chamber,
   sequentially supplying a halogen-containing gas as pulses while flowing the inert gas in the absence of a plasma, and
   exposing the silicon substrate to a first plasma to remove a layer of the silicon substrate.

2. The method of claim 1, wherein the
   the first plasma comprises argon (Ar), and wherein the ALE process further comprises
   repeating the flowing, the sequentially supplying, and the exposing.

3. The method of claim 1, wherein the halogen-containing gas comprises $CF_4$ or $NF_3$.

4. The method of claim 1, wherein the ALE process further comprises exposing the silicon substrate to a second plasma comprising hydrogen prior to the exposing to the halogen-containing gas.

5. The method of claim 1, further comprising, prior to the ALE process, exposing the silicon substrate to a fluorine-containing gas.

6. The method of claim 1, wherein the patterned photoresist layer comprises tin oxide.

7. The method of claim 1, further comprising, after performing the ALE process, applying a hydrogen-based plasma etching process to remove remaining metal oxides over the silicon substrate.

8. The method of claim 1, wherein the substrate comprises silicon oxide, the method further comprising a reduction step to reduce a surface of the silicon substrate to silicon prior to the ALE process.

9. A method of processing silicon a substrate, the method comprising:
   performing an atomic layer etching (ALE) process to etch silicon of the silicon substrate selectively to a metal oxide disposed over the silicon substrate, the ALE process comprising:
   in the absence of a plasma, exposing the silicon substrate to a halogen-containing gas to form a modified surface layer comprising silicon,
   exposing the modified surface to a first plasma comprising argon (Ar) to etch the modified surface layer, and
   repeating the two exposure steps; and
   after performing the ALE process, applying a hydrogen-based plasma etching process to remove remaining metal oxides over the silicon substrate.

10. The method of claim 9, wherein the metal oxide comprises tin oxide, and wherein the halogen-containing gas comprises $CF_4$ or $NF_3$.

11. The method of claim 9, wherein the ALE process removes the silicon at a first etch rate and the metal oxide at a second etch rate, the first etch rate being greater than the second etch rate.

12. The method of claim 9, wherein the ALE process further comprises, prior to the exposing to the halogen-containing gas, exposing the silicon substrate to a second plasma comprising hydrogen in the plasma etch chamber.

13. The method of claim 9, wherein the ALE process is performed in a plasma etch chamber, the ALE process further comprising, after the exposing to the first plasma, purging etch products from the plasma etch chamber.

14. The method of claim 9, wherein the ALE process is performed using a plasma system comprising a first process section and a second process section, and wherein the exposing to the halogen-containing gas is performed in the first process section and the exposing to the first plasma in the second process section.

15. The method of claim 14, wherein the plasma system comprises a rotating stage configured to hold the silicon substrate, the ALE process further comprising transferring the silicon substrate from the first process section to the second process section by rotating the rotating stage.

16. A method of processing a substrate, the method comprising:
   forming a patterned tin oxide layer over a silicon (Si) substrate in a process chamber, a portion of the Si substrate being exposed after forming the patterned tin oxide layer;
   cyclically exposing the Si substrate to a first plasma comprising hydrogen;
   flowing inert gas into the process chamber;
   sequentially supplying a halogen-containing gas as pulses while flowing the inert gas in the absence of a plasma, the supplying forming a modified Si surface; and
   etching the modified Si surface selectively to the patterned tin oxide layer by exposing the modified Si surface to a second plasma comprising argon (Ar).

17. The method of claim 16, wherein forming the patterned tin oxide layer comprises:

forming a photoresist layer over the Si substrate, the photoresist layer comprising tin and oxygen;

exposing the photoresist layer to a pattern of an extreme ultraviolet (EUV) irradiation, an EUV-exposed portion of the photoresist forming tin oxide; and developing the photoresist layer to remove an unreacted portion of the photoresist layer and form the patterned tin oxide layer from the EUV-exposed portion of the photoresist.

18. The method of claim 17, wherein the exposing to the pattern of the EUV irradiation is performed with a dose between 1 mJ/cm$^2$ and 30 mJ/cm$^2$.

19. The method of claim 16, wherein the patterned tin oxide layer has a pattern with a pitch size between 10 nm and 40 nm.

20. The method of claim 16, wherein the exposing to the halogen-containing gas is performed at a temperature between 10° C. and 30° C.

* * * * *